United States Patent
Igarashi et al.

(10) Patent No.: US 9,733,284 B2
(45) Date of Patent: Aug. 15, 2017

(54) CURRENT DETECTION CIRCUIT

(71) Applicant: SII Semiconductor Corporation, Chiba-shi, Chiba (JP)

(72) Inventors: Atsushi Igarashi, Chiba (JP); Nao Otsuka, Chiba (JP); Masakazu Sugiura, Chiba (JP)

(73) Assignee: SII SEMICONDUCTOR CORPORATION, Chiba-Shi, Chiba (JP)

( * ) Notice: Subject to any disclaimer, the term of this patent is extended or adjusted under 35 U.S.C. 154(b) by 0 days.

(21) Appl. No.: 15/090,810

(22) Filed: Apr. 5, 2016

(65) Prior Publication Data

US 2016/0305985 A1  Oct. 20, 2016

(30) Foreign Application Priority Data

Apr. 20, 2015 (JP) .................................. 2015-086139

(51) Int. Cl.
  *G01R 19/00* (2006.01)
  *H03F 3/45* (2006.01)
  *H03K 5/08* (2006.01)

(52) U.S. Cl.
  CPC ..... *G01R 19/0092* (2013.01); *H03F 3/45273* (2013.01); *H03K 5/08* (2013.01); *H03F 2200/91* (2013.01)

(58) Field of Classification Search
  CPC . G01R 19/00; G01R 19/0092; H03F 3/45273; H03K 5/08
  USPC ............ 327/50, 51, 52, 54, 72, 73, 309, 318
  See application file for complete search history.

(56) References Cited

U.S. PATENT DOCUMENTS

| | | | | |
|---|---|---|---|---|
| 3,972,003 A | * | 7/1976 | Schroeder | ........ H03K 19/01806 330/261 |
| 7,659,706 B2 | | 2/2010 | Nishida | |
| 2004/0120200 A1 | * | 6/2004 | Gogl | ...................... G11C 7/067 365/210.1 |
| 2007/0139839 A1 | | 6/2007 | Yoshihara | |
| 2008/0002481 A1 | * | 1/2008 | Gogl | ....................... G11C 5/02 365/189.06 |

* cited by examiner

*Primary Examiner* — William Hernandez

(74) *Attorney, Agent, or Firm* — Brinks Gilson & Lione

(57) ABSTRACT

To provide a current detection circuit capable of suppressing the occurrence of a large potential difference between input terminals of a differential amplifier circuit, and preventing degradation of input transistors. A differential amplifier circuit is equipped with a clamp circuit which limits gate-source voltages of a pair of PMOS transistors each having a bulk and a source connected to each other with the sources of the pair of PMOS transistors as input terminals.

3 Claims, 5 Drawing Sheets

CURRENT DETECTION CIRCUIT

RELATED APPLICATIONS

This application claims priority under 35 U.S.C. §119 to Japanese Patent Application No. 2015-086139 filed on Apr. 20, 2015, the entire content of which is hereby incorporated by reference.

BACKGROUND OF THE INVENTION

Field of the Invention

The present invention relates to a current detection circuit which detects a load current flowing through a load.

Background Art

A related art current detection circuit will be described.

FIG. 4 is a related art current detection circuit shown in Patent Document 1. The related art current detection circuit is comprised of a first resistor 201, a second resistor 202 having the same temperature characteristics as those of the first resistor 201, a differential amplifier circuit 300, a PMOS transistor 400, a resistive element 500, and a load 600.

A load current which flows through the load 600 flows into the first resistor 201, so that a voltage drop is generated by the first resistor 201. The differential amplifier circuit 300 controls a gate of the PMOS transistor 400 in such a manner that a voltage drop in the second resistor becomes equal to the voltage drop in the first resistor. Thus, a detection current determined by the ratio between the values of the first resistor 201 and the second resistor 202, and the value of the load current is generated and outputted from a drain of the PMOS transistor 400. This detection current flows through the resistive element 500, where it is converted into a voltage signal, which is in turn outputted.

In such a current detection circuit, one small in resistance value is used for the first resistor 201 to suppress the voltage drop to be small. Thus, the differential amplifier circuit 300 is required to have a wide in-phase input voltage in such a manner that it can normally be operated even in the case of an input voltage close to a power supply voltage.

A voltage detection circuit equipped with a differential amplifier circuit having a wide in-phase input voltage range, which is illustrated in FIG. 5, has been disclosed in, for example, Patent Document 2. The differential amplifier circuit 300 is comprised of PMOS transistors 301 and 302, and NMOS transistors 351 and 352.

The NMOS transistors 351 and 352 have gates connected in common and are operated as constant current sources by applying a constant bias voltage $V_{BIS}$ thereto. The PMOS transistors 301 and 302 are current-mirror connected and have sources respectively connected to a non-inversion input terminal and an inversion input terminal of the differential amplifier circuit 300. The PMOS transistors 301 and 302 are operated as input parts of the differential amplifier circuit 300. A PMOS transistor 252 is operated as a reference voltage circuit. A PMOS transistor 251 is an output transistor. The voltage detection circuit detects an output voltage $V_{OUT}$ of the output transistor.

The differential amplifier circuit 300 generates a difference between gate-source voltages of the PMOS transistors 301 and 302 according to a difference in potential between the non-inversion input terminal and the inversion input terminal and outputs a signal $V_{DET}$ corresponding to the difference voltage from an output terminal.

[Patent Document 1] Japanese Patent Application Laid-Open No. 2007-241411

[Patent Document 2] Japanese Patent Application Laid-Open No. 2007-166444

SUMMARY OF THE INVENTION

The related art current detection circuit, however, has a possibility that when abnormalities such as a ground fault occur in each input terminal of the differential amplifier circuit 300, for example, an excessive potential difference will occur between the input terminals. In doing so, an excessive voltage is applied between the gate and source of each input transistor of the differential amplifier circuit 300. When a negative voltage (gate potential-source potential<0) is applied between the gate and source thereof in a high-temperature condition, a phenomenon called NBTI in which characteristics such as Ids, Vth, etc. change occurs in the PMOS transistor. Thus, there is a fear that the characteristics of each input transistor of the differential amplifier circuit may change and an input offset voltage may be generated. As a result, a problem arises that a detected current of the current detection circuit changes.

Further, there is a fear that when the input transistor is of an element low in gate breakdown voltage, the characteristics of the element may be deteriorated to generate an input offset voltage. As a result, a problem arises that a detection current of the current detection circuit changes.

The present invention has been made in terms of the above problems. The present invention provides a current detection circuit equipped with a differential amplifier circuit, which even though a large potential difference occurs between input terminals of the differential amplifier circuit, relaxes an excessive voltage applied between a gate and a source of each of input transistors and prevents a change in the characteristics of the input transistor and degradation thereof.

In order to solve the related art problems, the current detection circuit of the present invention is configured as follows:

The current detection circuit is provided which is equipped with a differential amplifier circuit that adjusts a voltage for controlling an output transistor to thereby control a load current and generates a detection current based on a voltage applied to a resistor provided in series with the output transistor, and which monitors the value of the detection current to thereby detect the value of the load current. In the current detection circuit, the differential amplifier circuit includes a clamp circuit for limiting gate-source voltages of a pair of PMOS transistors each having a bulk and a source connected to each other with sources of the pair of PMOS transistors as input terminals.

According to the current detection circuit of the present invention, even when an excessive potential difference occurs between the input terminals of the differential amplifier circuit, an excessive voltage applied between the gate and source of each of the input transistors of the differential amplifier circuit can be relaxed. It is thus possible to provide a current detection circuit which prevents the occurrence of an input offset voltage due to a change in the characteristics of each of the input transistors of the differential amplifier circuit and its degradation and is good in accuracy.

DETAILED DESCRIPTION OF THE PREFERRED EMBODIMENTS

A current detection circuit of the present invention will hereinafter be described with reference to the accompanying drawings.

Figure 1:
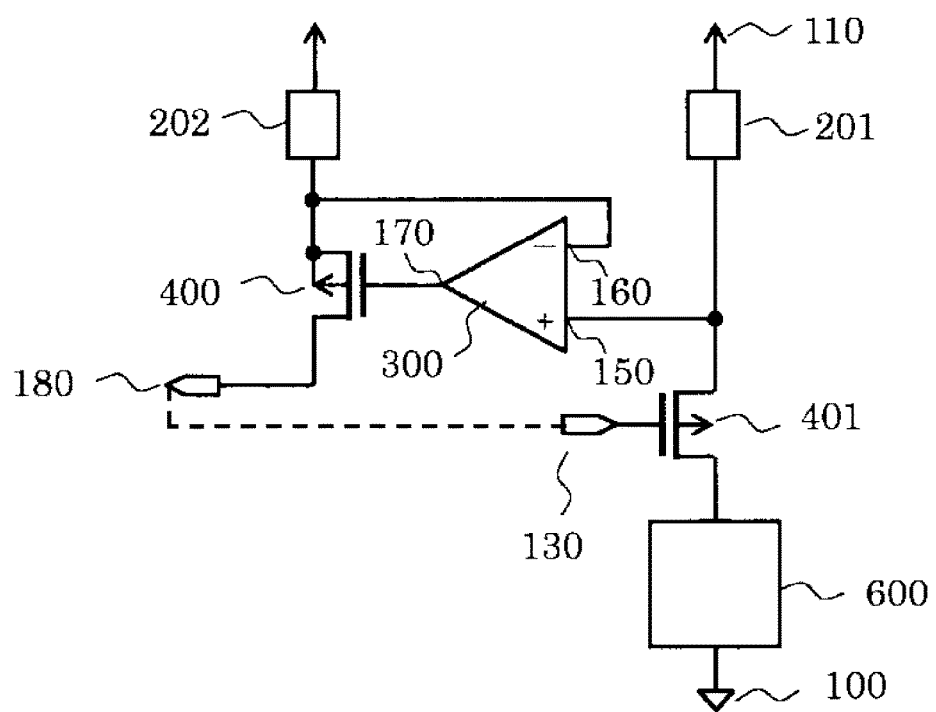
FIG. 1 is a circuit diagram of a current detection circuit according to the present embodiment.

FIG. 1 is a circuit diagram of a current detection circuit according to the present embodiment. The current detection circuit is comprised of a ground terminal 100, a power supply terminal 110, an output terminal 180, first and second resistors 201 and 202 having the same temperature characteristics, a differential amplifier circuit 300, and a PMOS transistor 400.

The first resistor 201 has one end connected to the power supply terminal 110, and the other end connected to a first input terminal 150 of the differential amplifier circuit 300 and a source of an output transistor 401. The second resistor 202 has one end connected to the power supply terminal 110, and the other end connected to a second input terminal 160 of the differential amplifier circuit 300 and a source and a bulk of the PMOS transistor 400. The output transistor 401 has a drain connected to a load 600, and a gate connected to a control terminal 130. The PMOS transistor 400 has a gate connected to an output terminal 170 of the differential amplifier circuit 300, and a drain connected to the output terminal 180 of the current detection circuit.

The current detection circuit according to the present embodiment will be described as a configuration to detect an overcurrent of the output transistor 401, of a high side switch which causes current to flow through the load 600 from the power supply terminal 110 through the output transistor 401.

Figure 2:
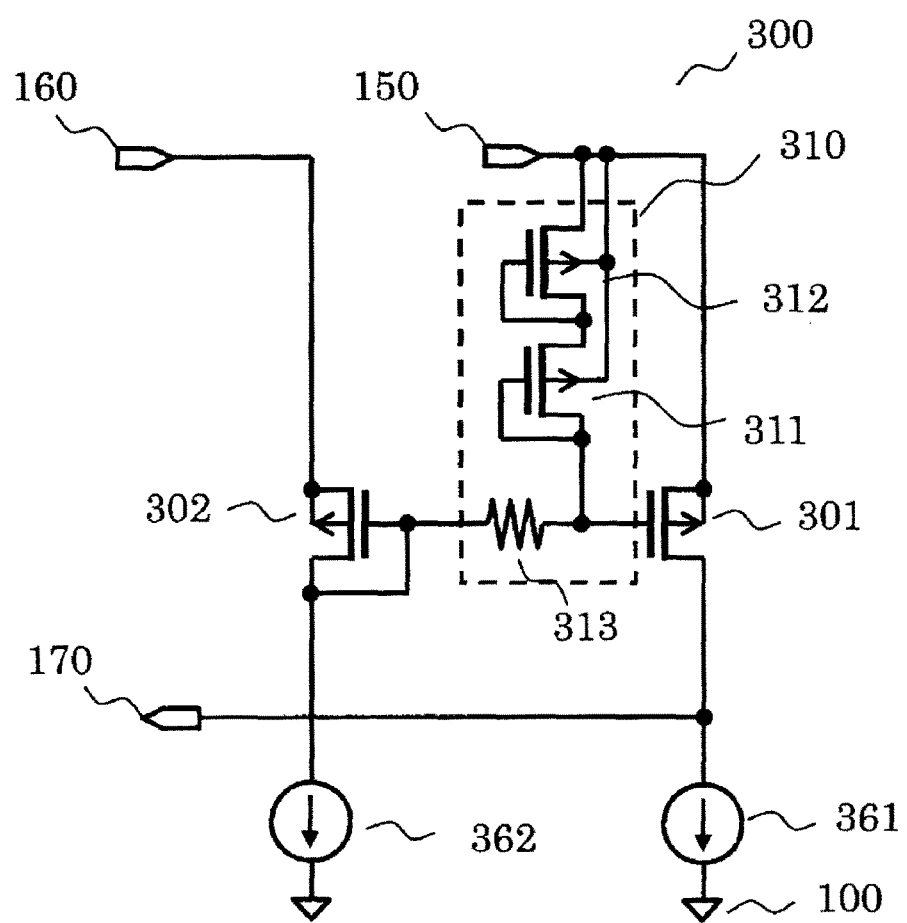
FIG. 2 is a circuit diagram illustrating one example of a differential amplifier circuit of the current detection circuit according to the present embodiment.

FIG. 2 is a circuit diagram illustrating one example of the differential amplifier circuit of the current detection circuit according to the present embodiment. The differential amplifier circuit 300 is comprised of a first input terminal 150, a second input terminal 160, an output terminal 170, a pair of input transistors 301 and 302, first and second constant current sources 361 and 362, and a clamp circuit 310. The clamp circuit 310 is comprised of PMOS transistors 311 and 312, and a resistive element 313.

The input transistor 301 has a bulk and a source connected to the first input terminal 150. The input transistor 302 has a bulk and a source connected to the second input terminal 160. The first constant current source 361 has one end connected to the ground terminal, and the other end connected to a drain of the input transistor 301 and the output terminal 170. The second constant current source 362 has one end connected to the ground terminal, and the other end connected to a drain and a gate of the input transistor 302. The clamp circuit 310 has a first terminal connected to the source of the input transistor 301, a second terminal connected to a gate of the input transistor 301, and a third terminal connected to the other end of the second constant current source 362.

The PMOS transistor 312 has a source and a bulk connected to the first terminal, and a gate and a drain connected to a source and a bulk of the PMOS transistor 311. The PMOS transistor 311 has a gate and a drain connected to the second terminal. The resistive element 313 is connected between the second terminal and the third terminal.

The operation of the current detection circuit equipped with the differential amplifier circuit of FIG. 2 will next be described.

When a load current flows through the load 600 in a state in which the output transistor 401 is ON, a current equal to the load current flows also through the first resistor 201. Hence, a voltage drop is generated by the resistance value of the first resistor 201 and the value of the load current. The differential amplifier circuit 300 controls the gate of the PMOS transistor 400 in such a manner that a voltage drop in the second resistor 202 becomes equal to the voltage drop in the first resistor 201, thereby to adjust a current flowing through the second resistor 202. As a result, a detection current determined by the ratio between the resistance value of the first resistor and the resistance value of the second resistor, and the value of the load current is outputted from the output terminal 180 through the drain of the PMOS transistor.

At this time, a gate-source voltage of each of the input transistors 301 and 302 in the differential amplifier circuit 300 is Vth+Vov. Thus, since the PMOS transistors 311 and 312 of the clamp circuit 310 are both OFF, the clamp circuit 310 does not interfere with a current detecting operation.

As described above, if the voltage of the control terminal 130 connected to the gate of the output transistor 401 is adjusted according to the detected value of load current, the load current can be controlled so as not to be a constant value or more. Further, if the voltage of the control terminal 130 is set such that the output transistor 401 is turned OFF, it is possible to stop the load current.

A description will next be made about the operation where the first input terminal 150 of the differential amplifier circuit 300 is subjected to a ground fault.

Assuming that no abnormality occurs in the second input terminal 160 of the differential amplifier circuit 300, and the voltage at the second input terminal 160 is a voltage close to a power supply voltage, an excessive voltage difference occurs between the first input terminal 150 and the second input terminal 160. Since, at this time, the gate and drain of the input transistor 302 are connected to each other, and a drain current is taken as the constant current source 362, the gate-source voltage of the input transistor 302 is Vth+Vov (gate potential-source potential<0). Thus, no excessive voltage is applied between the gate and source of the input transistor 302.

On the other hand, in the input transistor 301, the voltage between the gate and source thereof is restricted to a forward voltage (gate potential-source potential>0) of a parasitic diode between the drain and bulk of the PMOS transistor 311 configuring the clamp circuit 310 by the parasitic diode therebetween. Thus, no excessive voltage is applied between the gate and source of the input transistor 301. Consequently, it is possible to prevent the occurrence of an input offset voltage due to a change in the characteristics of each input transistor of the differential amplifier circuit 300 and its degradation.

A description will next be made about the operation where the second input terminal 160 of the differential amplifier circuit 300 is subjected to a ground fault.

Assuming that no abnormality occurs in the first input terminal 150 of the differential amplifier circuit 300, and the voltage at the first input terminal 150 is a voltage close to the power supply voltage, an excessive voltage difference occurs between the first input terminal 150 and the second input terminal 160. Since, at this time, the gate and drain of the input transistor 302 are connected to each other, the gate-source voltage of the input transistor 302 is restricted to a forward voltage (gate potential-source potential>0) of a parasitic diode between the drain and bulk of the input transistor 302 by the parasitic diode therebetween. Thus, no excessive voltage is applied between the gate and source of the input transistor 302. On the other hand, although the PMOS transistors 311 and 312 which configure the clamp circuit 310 are turned ON, the gate-source voltage of the input transistor 301 is limited to 2×(Vth+Vov) (gate potential-source potential<0) because the resistive element 313 for limiting the current is provided. Thus, no excessive voltage is applied between the gate and source of the input transistor 301. Consequently, it is possible to prevent the occurrence of an input offset voltage due to a change in the characteristics of each input transistor of the differential amplifier circuit 300 and its degradation.

As described above, there can be provided a current detection circuit in which no excessive voltage is applied between the gate and source of each of the input transistors 301 and 302 even though the first input terminal 150 or the second input terminal 160 in the differential amplifier circuit 300 is subjected to the ground fault, and which prevents the occurrence of the input offset voltage due to the change in the characteristics of each of the input transistors 301 and 302 and its degradation and is good in accuracy.

Incidentally, although the clamp circuit 310 has been described as the series connection of the two PMOS transistors of which the gates and drains are connected, and the resistive element, the number of elements as the PMOS transistors connected in series is not restricted. Three or more PMOS transistors may be configured to be connected in series. One PMOS transistor high in threshold voltage may be used. Such a configuration as not to interfere with the operation of the current detection circuit at the normal time and as to enable the gate-source voltage of the input transistor to be limited to within a desired value at the abnormal time may be adopted.

Figure 3:
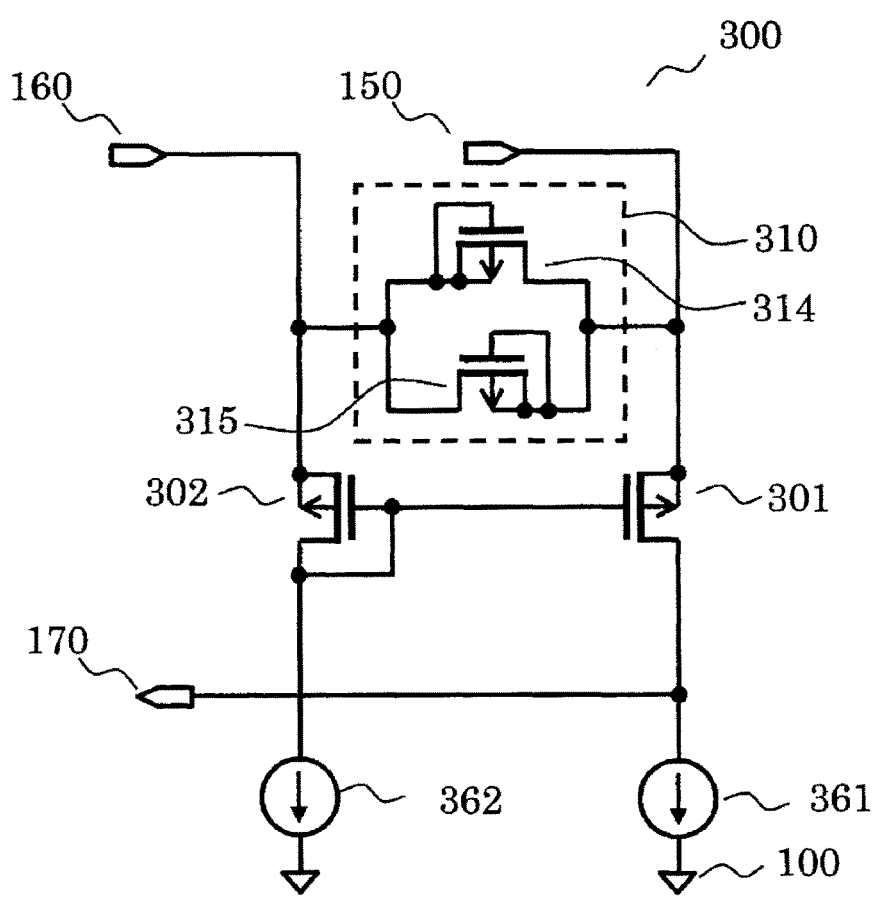
FIG. 3 is a circuit diagram illustrating another example of the differential amplifier circuit of the current detection circuit according to the present embodiment.
Figure 4:
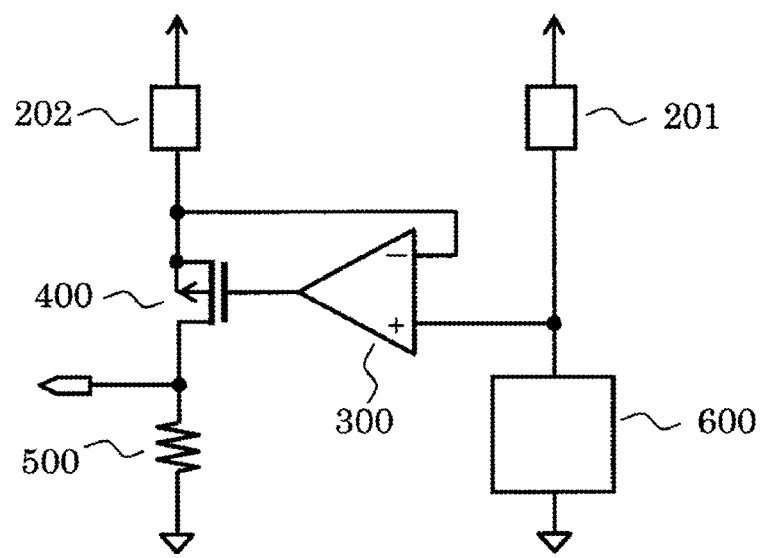
FIG. 4 is a circuit diagram of a current detection circuit.
Figure 5:
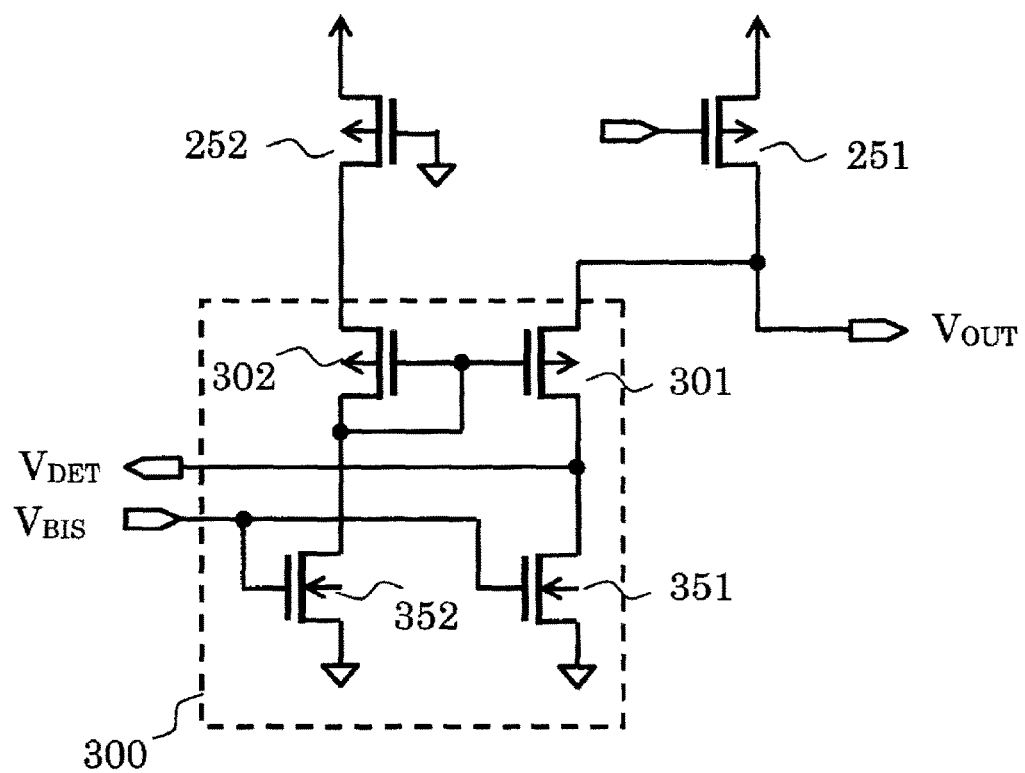
FIG. 5 is a circuit diagram of a related art differential amplifier circuit.

FIG. 3 is a circuit diagram illustrating another example of the differential amplifier circuit of the current detection circuit according to the present embodiment.

A clamp circuit 310 is comprised of PMOS transistors 314 and 315. The PMOS transistor 314 has a gate, a source and a bulk connected to a second input terminal 160, and a drain connected to a first input terminal 150. The PMOS transistor 315 has a gate, a source and a bulk connected to the first input terminal 150, and a drain connected to the second input terminal 160.

The operation of the current detection circuit equipped with the differential amplifier circuit illustrated in FIG. 3 will next be described.

The operation thereof in the normal state is similar to that of the current detection circuit equipped with the differential amplifier circuit illustrated in FIG. 2. The voltage of the first input terminal 150 and the voltage of the second input terminal 160 in the differential amplifier circuit 300 are approximately equal to each other. Thus, the PMOS transistors 314 and 315 which configure the clamp circuit 310 do not interfere with a current detecting operation because of being OFF.

A description will next be made about the operation where the first input terminal 150 of the differential amplifier circuit 300 is subjected to a ground fault.

At this time, the voltage between the first input terminal 150 and the second input terminal 160 is restricted to a forward voltage of a parasitic diode between the bulk and drain of the PMOS transistor 315 by the parasitic diode therebetween. Thus, the voltage between a gate and a source of each of input transistors 301 and 302 becomes a voltage further smaller than the forward voltage. Consequently, it is possible to prevent the occurrence of an input offset voltage due to a change in the characteristics of each input transistor and its degradation.

A description will next be made about the operation where the second input terminal 160 of the differential amplifier circuit 300 is subjected to a ground fault.

At this time, the voltage between the first input terminal 150 and the second input terminal 160 is restricted to a forward voltage of a parasitic diode between the bulk and drain of the PMOS transistor 314 by the parasitic diode therebetween. Thus, the voltage between the gate and source of each of the input transistors 301 and 302 becomes a voltage further smaller than the forward voltage. Consequently, it is possible to prevent the occurrence of an input offset voltage due to a change in the characteristics of each input transistor and its degradation.

As described above, there can be provided a current detection circuit in which no excessive voltage is applied between the gate and source of each of the input transistors 301 and 302 even though the first input terminal 150 or the second input terminal 160 in the differential amplifier circuit 300 is subjected to the ground fault, and which prevents the occurrence of the input offset voltage due to the change in the characteristics of each of the input transistors 301 and 302 and its degradation and is good in accuracy.

Incidentally, there is no limitation with respect to the resistances of the first and second resistors 201 and 202. A similar effect is obtained even in the case of, for example, the on resistance of a MOS transistor.

What is claimed is:

1. A current detection circuit comprising:
a differential amplifier circuit which adjusts a gate voltage of a first PMOS transistor according to a voltage generated by an input load current flowing across a first resistor, wherein the first PMOS transistor generates a detection current which is used to adjust an output transistor to thereby control the input load current, and the first resistor is connected in series with the output transistor, said generated detection current is used to monitor a value of the input load current,
wherein the differential amplifier circuit includes a clamp circuit for limiting gate-source voltages of a pair of PMOS transistors within the differential amplifier circuit, and each of the pair of PMOS transistors having a bulk and a source connected to each other, with the sources of each of the pair of PMOS transistors as input terminals to the differential amplifier circuit.

2. The current detection circuit according to claim 1, wherein the clamp circuit comprises a series circuit of at least one MOS transistor having a gate and a drain connected to each other, and a resistive element, and
wherein the clamp circuit limits the gate-source voltages of the pair of PMOS transistors by using a gate-source voltage of the MOS transistor in which a drain current is limited by a parasitic diode between a drain and a bulk of the MOS transistor and the resistive element.

3. The current detection circuit according to claim 1, wherein the clamp circuit comprises two MOS transistors each having a gate, a source and a bulk connected to each other and being connected in parallel in an opposite direction to each other, and wherein the clamp circuit limits the gate-source voltages of the pair of PMOS transistors by using parasitic diodes of the two MOS transistors.

* * * * *